United States Patent
Amali et al.

(10) Patent No.: US 10,141,415 B2
(45) Date of Patent: Nov. 27, 2018

(54) COMBINED GATE AND SOURCE TRENCH FORMATION AND RELATED STRUCTURE

(71) Applicant: Infineon Technologies Americas Corp., El Segundo, CA (US)

(72) Inventors: Adam Amali, Chandler, AZ (US); Ling Ma, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 7 days.

(21) Appl. No.: 14/993,292

(22) Filed: Jan. 12, 2016

(65) Prior Publication Data

US 2017/0200799 A1   Jul. 13, 2017

(51) Int. Cl.

| H01L 29/423 | (2006.01) |
|---|---|
| H01L 21/027 | (2006.01) |
| H01L 29/417 | (2006.01) |
| H01L 29/66 | (2006.01) |
| H01L 29/739 | (2006.01) |
| H01L 29/78 | (2006.01) |

(52) U.S. Cl.
CPC ...... *H01L 29/4236* (2013.01); *H01L 21/0273* (2013.01); *H01L 29/41766* (2013.01); *H01L 29/6634* (2013.01); *H01L 29/66348* (2013.01); *H01L 29/66727* (2013.01); *H01L 29/66734* (2013.01); *H01L 29/7397* (2013.01); *H01L 29/7813* (2013.01)

(58) Field of Classification Search
CPC .......................... H01L 29/7827; H01L 29/7813
See application file for complete search history.

(56) References Cited

U.S. PATENT DOCUMENTS

| 2006/0060916 | A1* | 3/2006 | Girdhar | H01L 29/407 257/330 |
|---|---|---|---|---|
| 2008/0211016 | A1 | 9/2008 | Boden | |
| 2011/0068386 | A1* | 3/2011 | Tai | H01L 29/407 257/328 |
| 2011/0291186 | A1* | 12/2011 | Yilmaz | H01L 29/4236 257/334 |
| 2012/0319199 | A1 | 12/2012 | Zeng et al. | |
| 2013/0313635 | A1* | 11/2013 | Nakano | H01L 21/8213 257/330 |

(Continued)

FOREIGN PATENT DOCUMENTS

| CN | 103137700 A | 6/2013 | | |
|---|---|---|---|---|
| WO | WO2007/129261 A2 * | 5/2007 | | H01L 29/78 |

*Primary Examiner* — Lex Malsawma
*Assistant Examiner* — Geoffrey Ida
(74) *Attorney, Agent, or Firm* — Murphy, Bilak & Homiller, PLLC

(57) ABSTRACT

A semiconductor device includes a gate trench in a semiconductor substrate, a source trench in the semiconductor substrate, the source trench having a first portion and a second portion under the first portion, where the first portion of the source trench is wider than the gate trench, and extends to a depth of the gate trench. The semiconductor device also includes a gate electrode and a gate trench dielectric liner in the gate trench, and a conductive filler and a source trench dielectric liner in the source trench. The semiconductor device further includes a source region between the gate trench and the source trench, a base region between the gate trench and the source trench, and a source contact coupled to the source region and the base region.

20 Claims, 16 Drawing Sheets

(56) References Cited

U.S. PATENT DOCUMENTS

2015/0214355 A1\* 7/2015 Nakano ............ H01L 29/41766
257/330
2015/0349113 A1\* 12/2015 Katoh ................ H01L 29/7813
257/331

\* cited by examiner

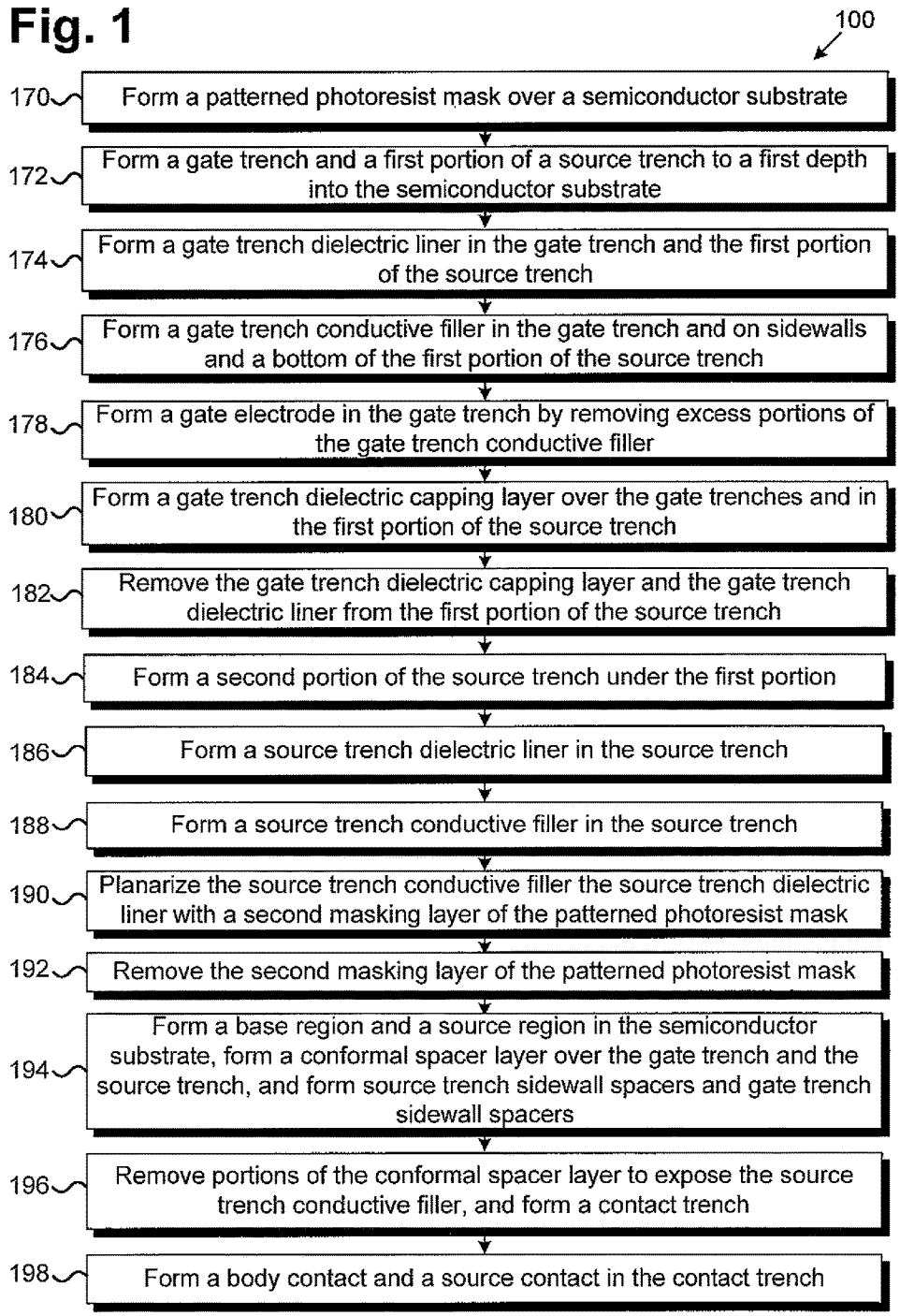

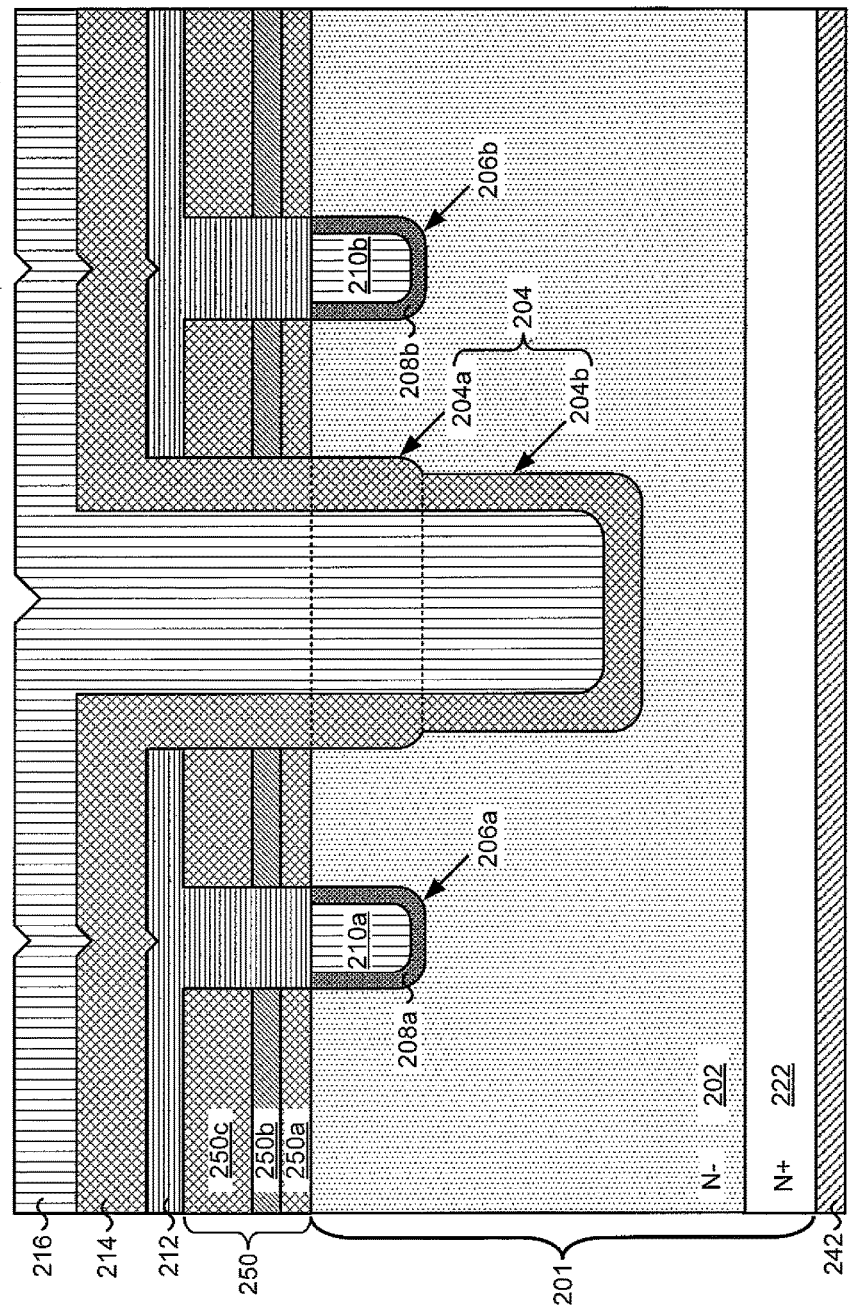

US 10,141,415 B2

COMBINED GATE AND SOURCE TRENCH FORMATION AND RELATED STRUCTURE

BACKGROUND

Power semiconductor devices, such as power metal oxide semiconductor field effect transistors (MOSFETs), have been widely used in power switching devices, such as power supplies, rectifiers, motor controllers, or so forth. Power semiconductor devices can be made with a trench topology to enhance power density.

Conventional fabrication processes for manufacturing a trench type power semiconductor device often involve several masks to accommodate forming complex structures, such as gate trenches and source trenches. Using multiple masks to etch adjacent source and gate trenches of different dimensions in different steps can be difficult due to errors introduced by the mask dimensions and alignment thereof at each masking step. Variations in semiconductor device fabrication can often lead to variations in device electrical performance such as on-state resistance ($R_{DSon}$) and breakdown voltage.

Accordingly, there is a need to overcome the drawbacks and deficiencies in the art by providing a fabrication process that can substantially eliminate device defects during the fabrication of trench type power semiconductor devices while enhancing the electrical performance characteristics thereof.

SUMMARY

The present disclosure is directed to a combined gate and source trench formation and related structure, substantially as shown in and/or described in connection with at least one of the figures, and as set forth in the claims.

BRIEF DESCRIPTION OF THE DRAWINGS

FIG. 1 is a flowchart illustrating a method of forming a semiconductor structure according to one implementation of the present application.

FIG. 2I illustrates a perspective cross-sectional view of a portion of a semiconductor structure processed in accordance with an intermediate action in the flowchart of FIG. 1 according to one implementation of the present application.

FIG. 2J illustrates a perspective cross-sectional view of a portion of a semiconductor structure processed in accordance with an intermediate action in the flowchart of FIG. 1 according to one implementation of the present application.

FIG. 2O illustrates a perspective cross-sectional view of a portion of a semiconductor structure processed in accordance with a final action in the flowchart of FIG. 1 according to one implementation of the present application.

DETAILED DESCRIPTION

Figure 2A:
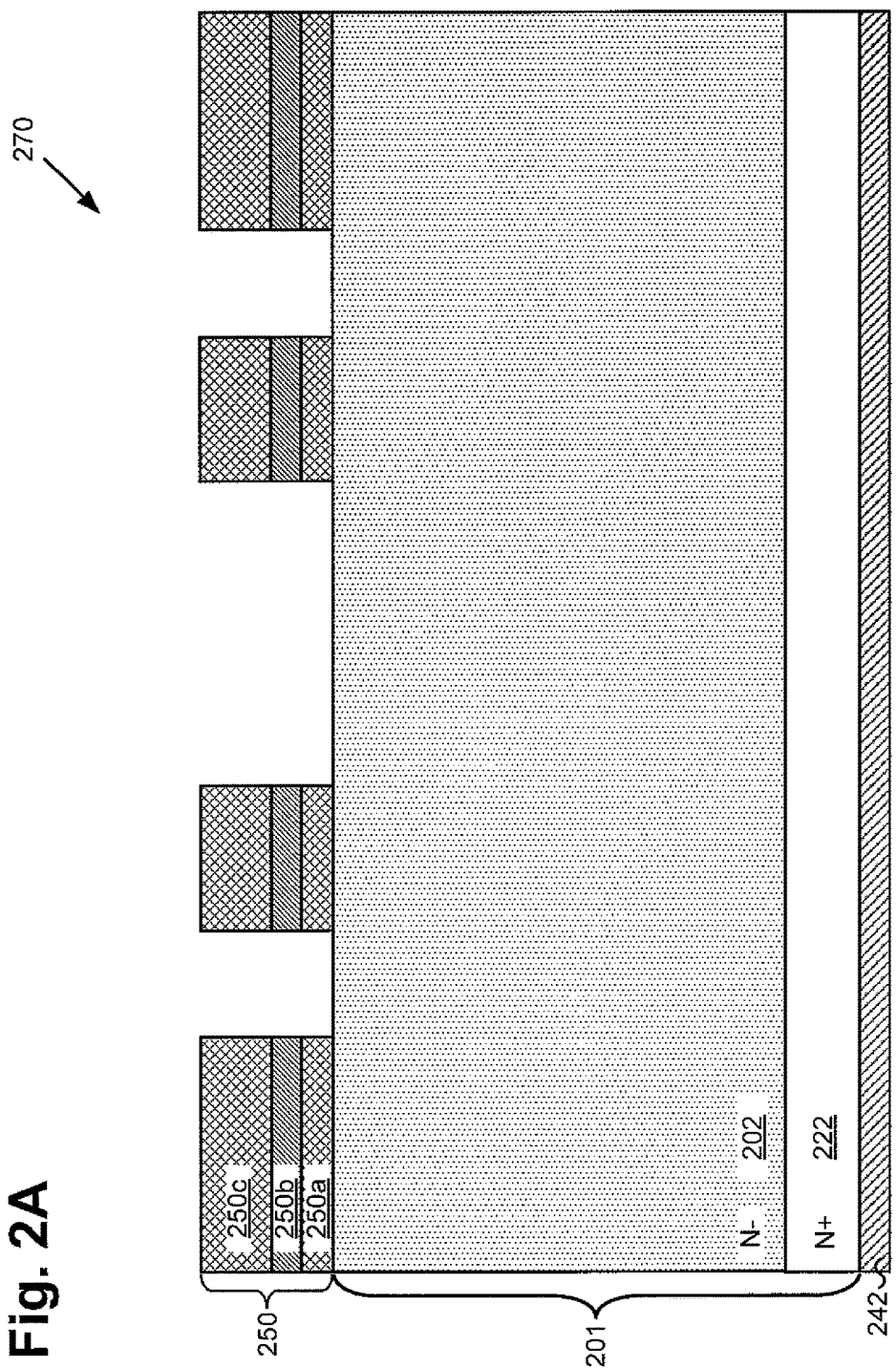
FIG. 2A illustrates a cross-sectional view of a portion of a semiconductor structure processed in accordance with an initial action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating an exemplary method of forming an exemplary semiconductor device according to an implementation of the present application. Certain details and features have been left out of the flowchart that are apparent to a person of ordinary skill in the art. For example, an action may consist of one or more subactions or may involve specialized equipment or materials, as known in the art. Actions 170, 172, 174, 176, 178, 180, 182, 184, 186, 188, 190, 192, 194, 196 and 198 indicated in flowchart 100 are sufficient to describe one implementation of the present inventive concepts, other implementations of the present inventive concepts may utilize actions different from those shown in flowchart 100. Moreover, semiconductor structures 270, 272, 274, 276, 278, 280, 282, 284, 286, 288, 290, 292, 294, 296 and 298 in FIGS. 2A, 2B, 2C, 2D, 2E, 2F, 2G, 2H, 2I, 2J, 2K, 2L, 2M, 2N and 2O illustrate the results of performing actions 170, 172, 174, 176, 178, 180, 182, 184, 186, 188, 190, 192, 194, 196 and 198 of flowchart 100, respectively. For example, semiconductor structure 270 is an exemplary structure of a portion of a semiconductor device after processing action 170, semiconductor structure 272 is an exemplary structure of a portion of a semiconductor device after the processing of action 172, semiconductor structure 284 is an exemplary structure of a portion of a semiconductor device after the processing of action 174, and so forth.

Referring to action 170 in FIG. 1 and semiconductor structure 270 in FIG. 2A, action 170 includes forming a patterned photoresist mask over a semiconductor substrate. Referring to FIG. 2A, semiconductor structure 270 illustrates a cross-sectional view of a portion of a semiconductor structure after completion of action 170 in flowchart 100 of FIG. 1, according to one implementation of the present disclosure. As illustrated in FIG. 2A, semiconductor structure 270 includes patterned photoresist mask 250 over semiconductor substrate 201.

As illustrated in FIG. 2A, semiconductor substrate 201 includes drift region 202 and drain region 222. Semiconductor substrate 201 may include any suitable semiconductor material, such as silicon. Drift region 202 is situated over drain region 222, which is situated over drain contact layer 242. In the present implementation, drain region 222 includes a highly doped semiconductor material as a drain of a semiconductor device, such as a power MOSFET or an insulated gate bipolar transistor (IGBT). As illustrated in FIG. 2A, drain region 222 is of a first conductivity type, and is shown as having N+ conductivity by way of example. In the present implementation, drain region 222 may include an N type dopant, such as phosphorus or arsenic. In another implementation, drain region 222 may include a P type dopant, such as boron. Drain contact layer 242 is formed at the bottom of drain region 222.

Drift region 202 may include any suitable semiconductor material that can be epitaxially grown (e.g., epitaxial layer) on drift region 202. For example, drift region 202 may include epitaxial silicon grown on drain region 222. As illustrated in FIG. 2A, drift region 202 is of the first conductivity type, and is shown as having N conductivity by way of example. In one implementation, drift region 202 can be intrinsically or pre-doped to be an N type material, or can be subsequently doped to become an N type material, for example. In the present implementation, drift region 202 may include an N type dopant, such as phosphorus or arsenic. In another implementation, drift region 202 may include a P type dopant, such as boron.

As illustrated in FIG. 2A, patterned photoresist mask 250 includes first masking layer (e.g., a pad oxide layer) 250a, second masking layer (e.g., a nitride based layer) 250b and third masking layer (e.g., an oxide based layer) 250c. First masking layer 250a, second masking layer 250b and third masking layer 250c may be successively formed over semiconductor substrate 201. For example, first masking layer 250a may formed on semiconductor substrate 201 by deposition or thermal oxidation, for example. Second masking layer 250b may be formed on first masking layer 250a by deposition or nitridation, for example. Third masking layer 250c may then be formed on second masking layer 250b by deposition or thermal oxidation, for example. The thickness of each of first masking layer 250a, second masking layer 250b and third masking layer 250c may be adjusted to suit the specific needs of a particular application. Thereafter, first masking layer 250a, second masking layer 250b and third masking layer 250c may be patterned using a trench mask (not explicitly shown in FIG. 2A) to form patterned photoresist mask 250.

Figure 2B:
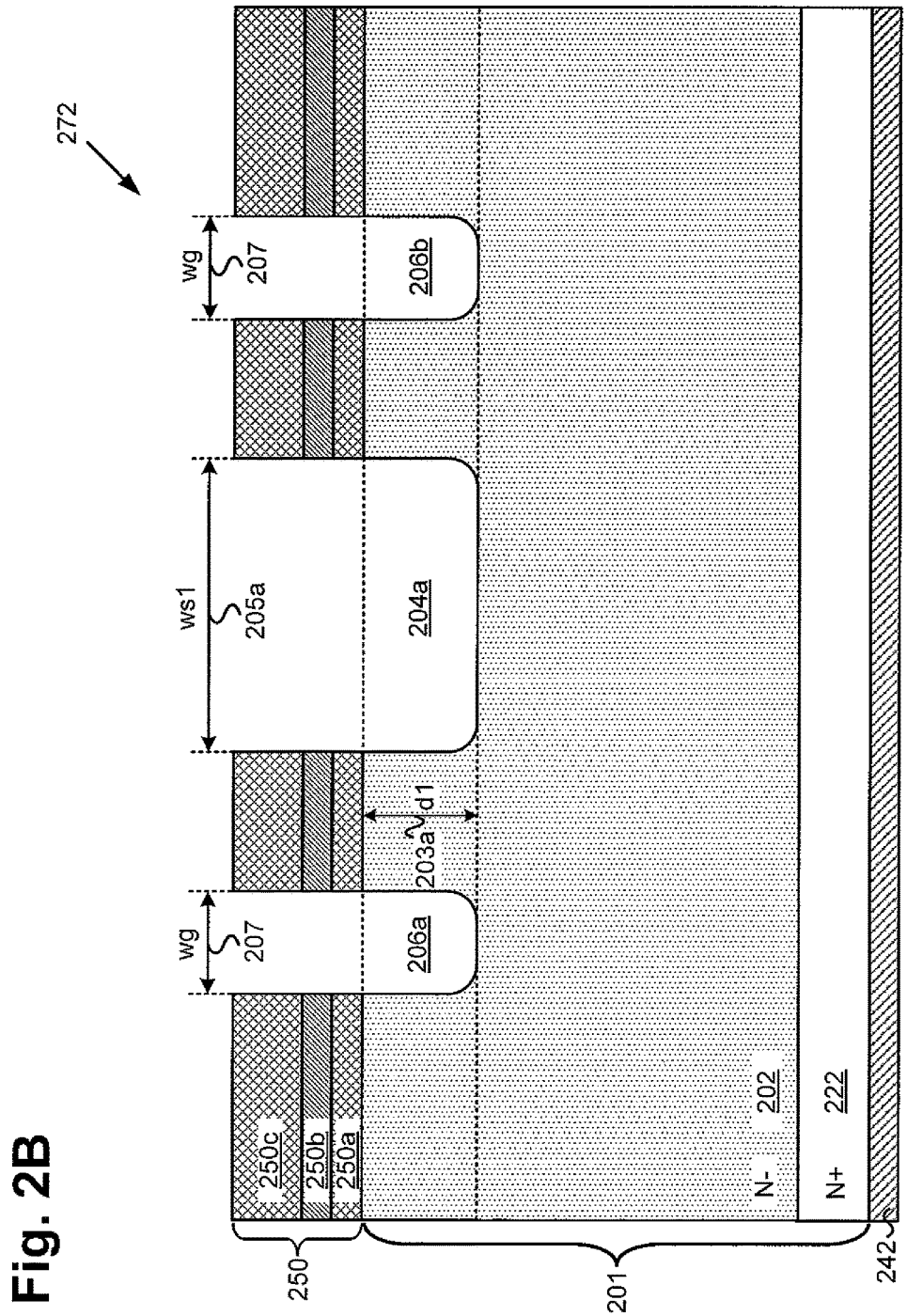
FIG. 2B illustrates a cross-sectional view of a portion of a semiconductor structure processed in accordance with an intermediate action in the flowchart of FIG. 1 according to one implementation of the present application.

Referring to action 172 in FIG. 1 and semiconductor structure 272 in FIG. 2B, action 172 includes forming a gate trench and a first portion of a source trench to a first depth into the semiconductor substrate. Referring to FIG. 2B, semiconductor structure 272 illustrates a cross-sectional view of a portion of a semiconductor structure after completion of action 172 in flowchart 100 of FIG. 1, according to one implementation of the present disclosure. As illustrated in FIG. 2B, semiconductor structure 272 includes gate trenches 206a and 206b and first portion 204a of source trench 204 having depth 203a into drift region 202 of semiconductor substrate 201.

In the present implementation, gate trenches 206a and 206b and first portion 204a of source trench 204 may be formed by etching the unmasked regions (e.g., regions not covered by patterned photoresist mask 250) of drift region 202 using, for example, an anisotropic etch. It is noted that, in contrast to a conventional process for manufacturing trench type semiconductor devices where source trenches are formed after gate conductive fillers are formed in gate trenches, implementations of the present application use a single photolithography masking action to etch both the gate and source trenches in a one-shot trench process. Because the source and gate trenches are formed in a single processing action, misalignments between the gate and source trenches can be effectively eliminated, thereby enabling smaller cell pitch and higher cell density.

As illustrated in FIG. 2B, gate trenches 206a and 206b and source trench 204 extend into drift region 202. Each of gate trenches 206a and 206b and first portion 204a of source trench 204 includes substantially parallel sidewalls extending into a bottom. In the present implementation, gate trenches 206a and 206b and first portion 204a of source trench 204 each include a U-shaped bottom. In another implementation, gate trenches 206a and 206b and first portion 204a of source trench 204 may each include sloped sidewalls and/or a flat bottom.

As illustrated in FIG. 2B, in the present implementation, first portion 204a of source trench 204 extends to depth 203a of gate trenches 206a and 206b. In another implementation, first portion 204a of source trench 204 may extend to a depth that is either greater or less than depth 203a of gate trenches 206a and 206b. It is noted that, first portion 204a of source trench 204 has width 205a that is substantially wider than width 207 of gate trenches 206a and 206b, where width 205a and width 207 are defined by the respective openings in patterned photoresist mask 250 formed in action 170.

In the present implementation, gate trenches 206a and 206b and source trench 204 may have a striped layout, where gate trenches 206a and 206b and source trench 204 are substantially parallel to one another in semiconductor substrate 201. In another implementation, gate trenches 206a and 206b and source trench 204 may have a cellular layout, where gate trenches 206a and 206b are parts of a continuous cellular trench surrounding source trench 204 in the center.

Figure 2C:
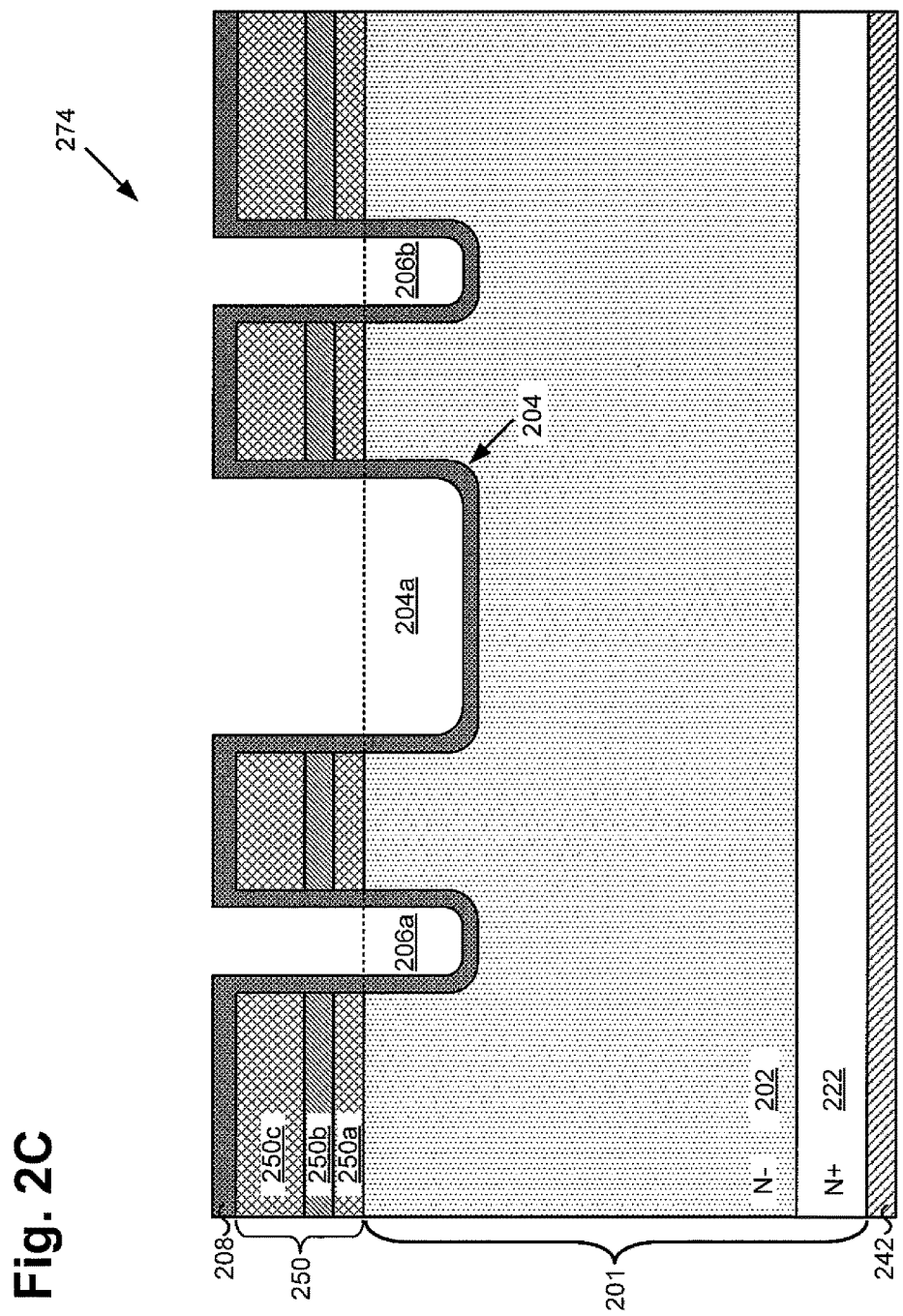
FIG. 2C illustrates a cross-sectional view of a portion of a semiconductor structure processed in accordance with an intermediate action in the flowchart of FIG. 1 according to one implementation of the present application.

Referring to action 174 in FIG. 1 and semiconductor structure 274 in FIG. 2C, action 174 includes forming a gate trench dielectric liner in the gate trench and the first portion of the source trench. Referring to FIG. 2C, semiconductor structure 274 illustrates a cross-sectional view of a portion of a semiconductor structure after completion of action 174 in flowchart 100 of FIG. 1, according to one implementation of the present disclosure. As illustrated in FIG. 2C, semiconductor structure 274 includes gate trench dielectric liner 208 over patterned photoresist mask 250, in gate trenches 206a and 206b, and in first portion 204a of source trench 204. Gate trench dielectric liner 208 lines the respective sidewalls and bottom of gate trenches 206a and 206b. Gate trench dielectric liner 208 is also formed in first portion 204a of source trench 204, lining the sidewalls and bottom of first portion 204a. In the present implementation, gate trench dielectric liner 208 includes silicon oxide (e.g., $SiO_2$). In other implementations, gate trench dielectric liner 208 may include any other suitable dielectric material.

Figure 2D:
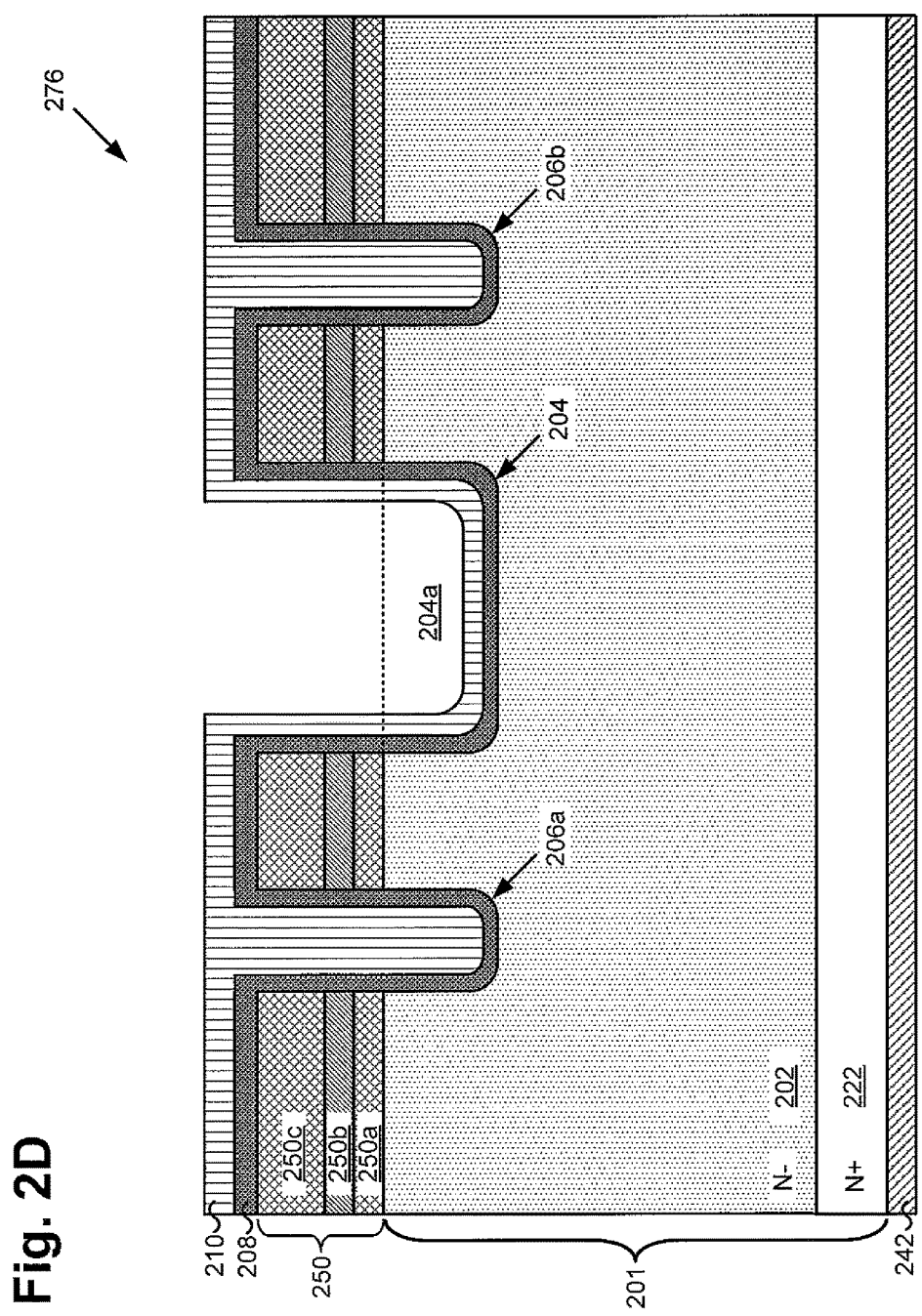
FIG. 2D illustrates a perspective cross-sectional view of a portion of a semiconductor structure processed in accordance with an intermediate action in the flowchart of FIG. 1 according to one implementation of the present application.

Referring to action 176 in FIG. 1 and semiconductor structure 276 in FIG. 2D, action 176 includes forming a gate trench conductive filler in the gate trench and on sidewalls and a bottom of the first portion of the source trench. Referring to FIG. 2D, semiconductor structure 276 illustrates a cross-sectional view of a portion of a semiconductor structure after completion of action 176 in flowchart 100 of FIG. 1, according to one implementation of the present disclosure. As illustrated in FIG. 2D, semiconductor structure 276 includes gate trench conductive filler 210 over patterned photoresist mask 250, in gate trenches 206a and 206b, and on the sidewalls and the bottom of first portion 204a of source trench 204. Gate trench conductive filler 210 fills the entire space in each of gate trenches 206a and 206b. By contrast, because first portion 204a of source trench 204 is significantly wider than gate trenches 206a and 206b, gate trench conductive filler 210 does not fill the entire space in first portion 204a of source trench 204. Instead, gate trench conductive filler 210 only lines the sidewalls and the bottom of first portion 204a of source trench 204, which makes the removal of gate trench conductive filler 210 from first portion 204a of source trench 204 in a subsequent step substantially easier and faster than removing a gate trench conductive filler from an entirely filled source trench. In the present implementation, gate trench conductive filler 210 includes doped polycrystalline silicon. In another implementation, gate trench conductive filler 210 may include any suitable conductive material, such as metallic material.

Figure 2E:
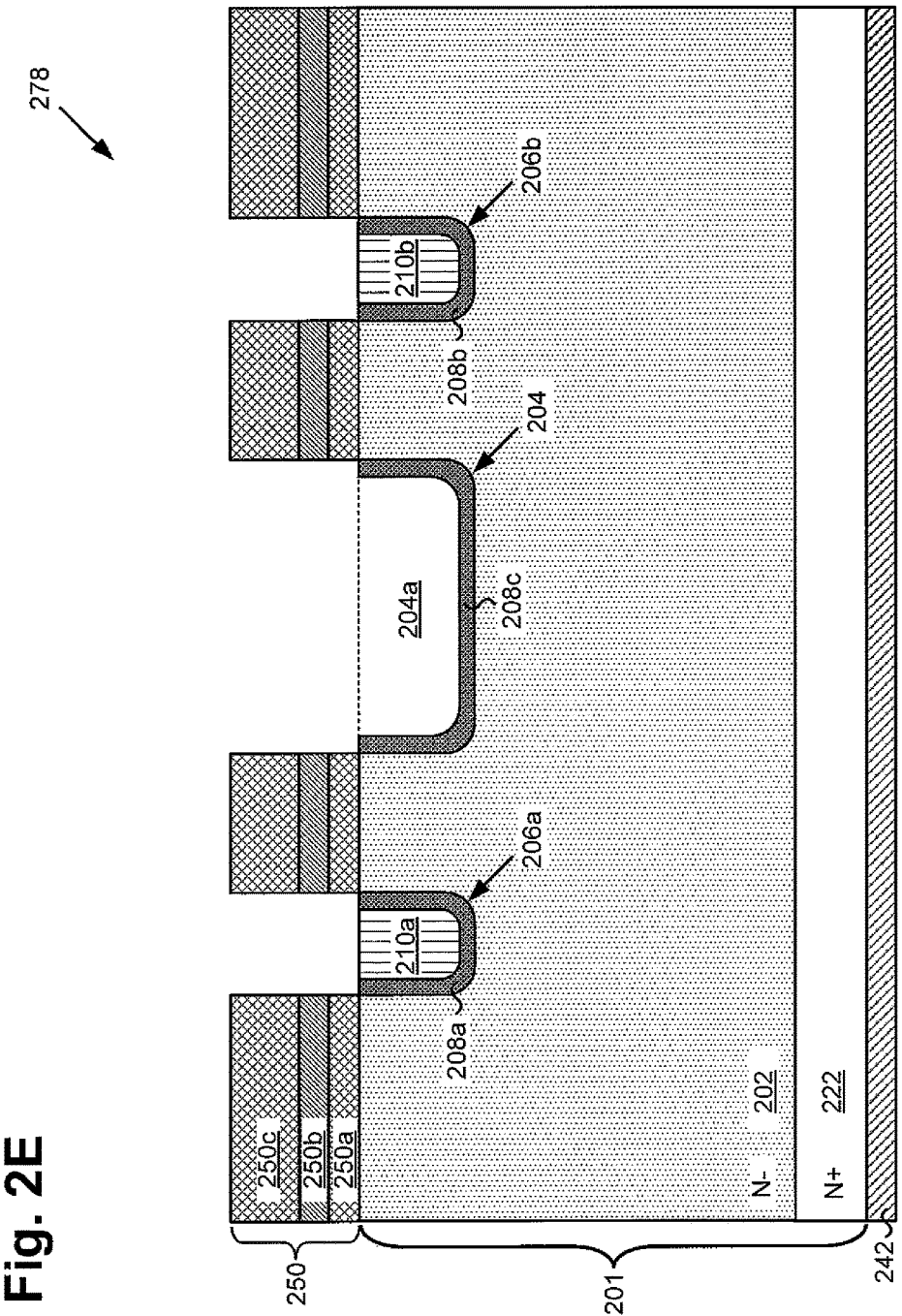
FIG. 2E illustrates a perspective cross-sectional view of a portion of a semiconductor structure processed in accordance with an intermediate action in the flowchart of FIG. 1 according to one implementation of the present application.

Referring to action 178 in FIG. 1 and semiconductor structure 278 in FIG. 2E, action 178 includes forming a gate electrode in the gate trench by removing excess portions of the gate trench conductive filler. Referring to FIG. 2E, semiconductor structure 278 illustrates a cross-sectional view of a portion of a semiconductor structure after completion of action 178 in flowchart 100 of FIG. 1, according to one implementation of the present disclosure. As illustrated in FIG. 2E, semiconductor structure 278 includes gate electrodes 210a and 210b in gate trenches 206a and 206b, respectively. The excess portions of gate trench conductive filler 210 on top of patterned photoresist mask 250, above gate trenches 206a and 206b, and in first portion 204a of source trench 204, are removed by an etch back process, such as a gate poly etch back. It is noted that, in the present implementation, because of the presence of patterned photoresist mask 250, no additional mask is used during the etch back process, thereby saving manufacturing cost and time.

Figure 2F:
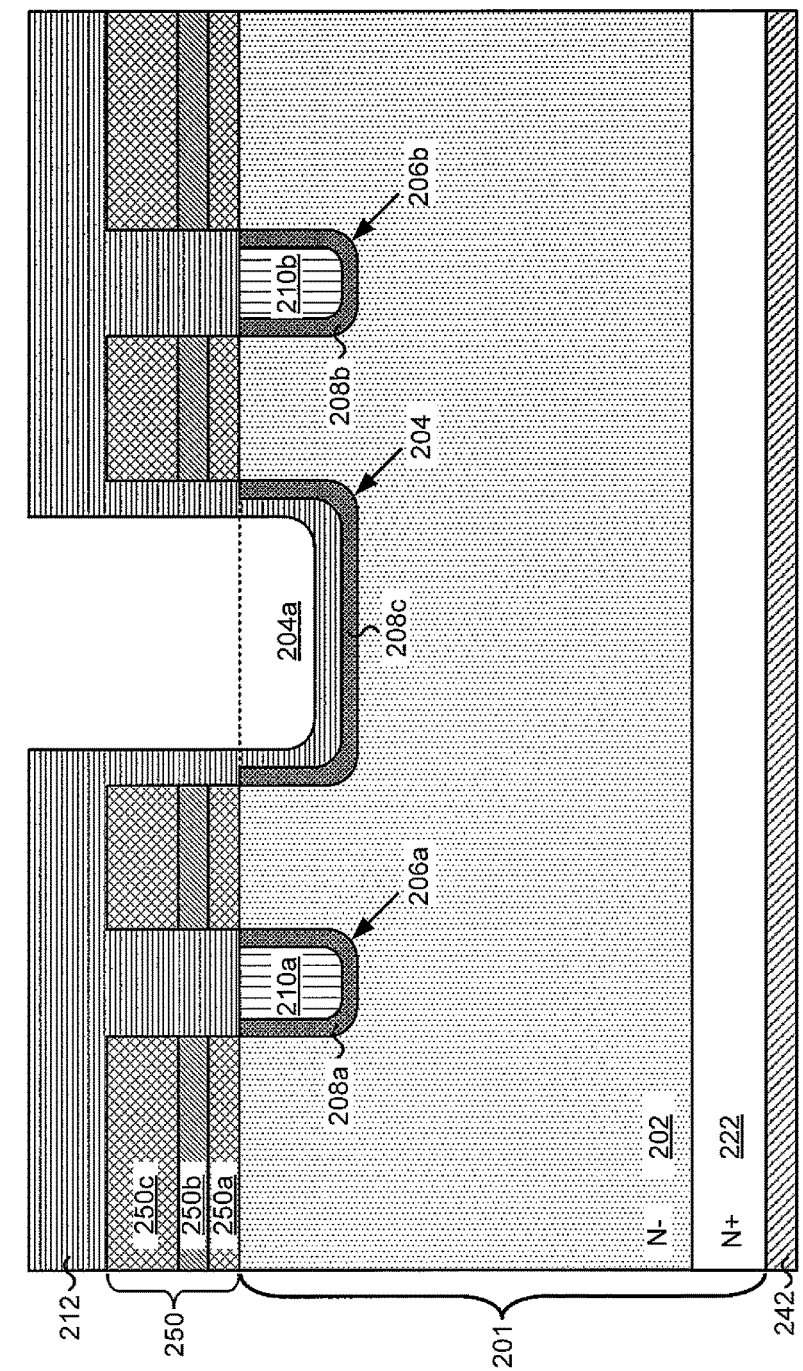
FIG. 2F illustrates a perspective cross-sectional view of a portion of a semiconductor structure processed in accordance with an intermediate action in the flowchart of FIG. 1 according to one implementation of the present application.

Referring to action 180 in FIG. 1 and semiconductor structure 280 in FIG. 2F, action 180 includes forming a gate trench dielectric capping layer over the gate trenches and in the first portion of the source trench. Referring to FIG. 2F, semiconductor structure 280 illustrates a cross-sectional view of a portion of a semiconductor structure after completion of action 180 in flowchart 100 of FIG. 1, according to one implementation of the present disclosure. As illustrated in FIG. 2F, semiconductor structure 280 includes gate trench dielectric capping layer 212 over patterned photoresist mask 250, over gate trenches 206a and 206b, and in first portion 204a of source trench 204. Gate trench dielectric capping layer 212 fills the entire space in the openings between patterned photoresist mask 250 above each of gate trenches 206a and 206b. By contrast, because first portion 204a of source trench 204 is significantly wider than gate trenches 206a and 206b, gate trench dielectric capping layer 212 does not fill the entire space in first portion 204a of source trench 204. Instead, gate trench dielectric capping layer 212 only lines the sidewalls and the bottom of first portion 204a of source trench 204. Gate trench dielectric capping layer 212 includes any suitable dielectric material, such as silicon oxide or boron phosphate silicate glass (BPSG).

Figure 2G:
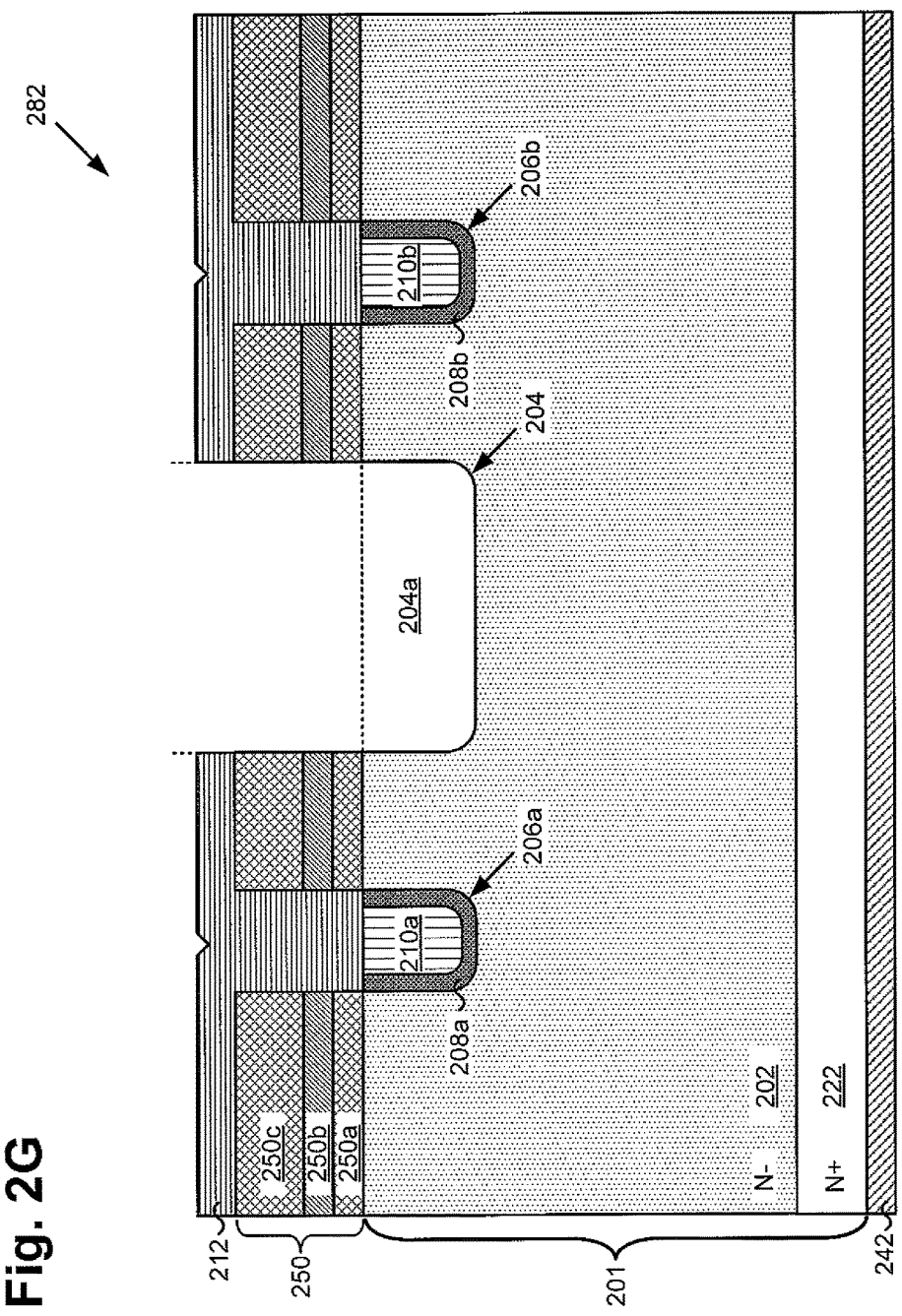
FIG. 2G illustrates a perspective cross-sectional view of a portion of a semiconductor structure processed in accordance with an intermediate action in the flowchart of FIG. 1 according to one implementation of the present application.

Referring to action 182 in FIG. 1 and semiconductor structure 282 in FIG. 2G, action 182 includes removing the gate trench dielectric capping layer and the gate trench dielectric liner from the first portion of the source trench. Referring to FIG. 2G, semiconductor structure 282 illustrates a cross-sectional view of a portion of a semiconductor structure after completion of action 182 in flowchart 100 of FIG. 1, according to one implementation of the present disclosure. As illustrated in FIG. 2G, semiconductor structure 282 undergoes a breakthrough etch back, where portions of gate trench dielectric capping layer 212 and gate trench dielectric liner 208c are removed from first portion 204a of the source trench 204. As can be seen in FIG. 2G, portions of gate trench dielectric capping layer 212 over patterned photoresist mask 250 and gate trenches 206a and 206b are also partially removed as a result of the breakthrough etch back. In the present implementation, a breakthrough oxide etch back may be performed to remove the portions of gate trench dielectric capping layer 212 and gate trench dielectric liner 208c from first portion 204a of source trench 204. As can be seen in FIG. 2G, after the breakthrough etch back in action 182, drain region 202 of semiconductor substrate 201 is exposed in first portion 204a of source trench 204. In another implementation, the sidewalls and the bottom of first portion 204a of source trench 204 may be covered with residual gate trench dielectric liner 208c.

Figure 2H:
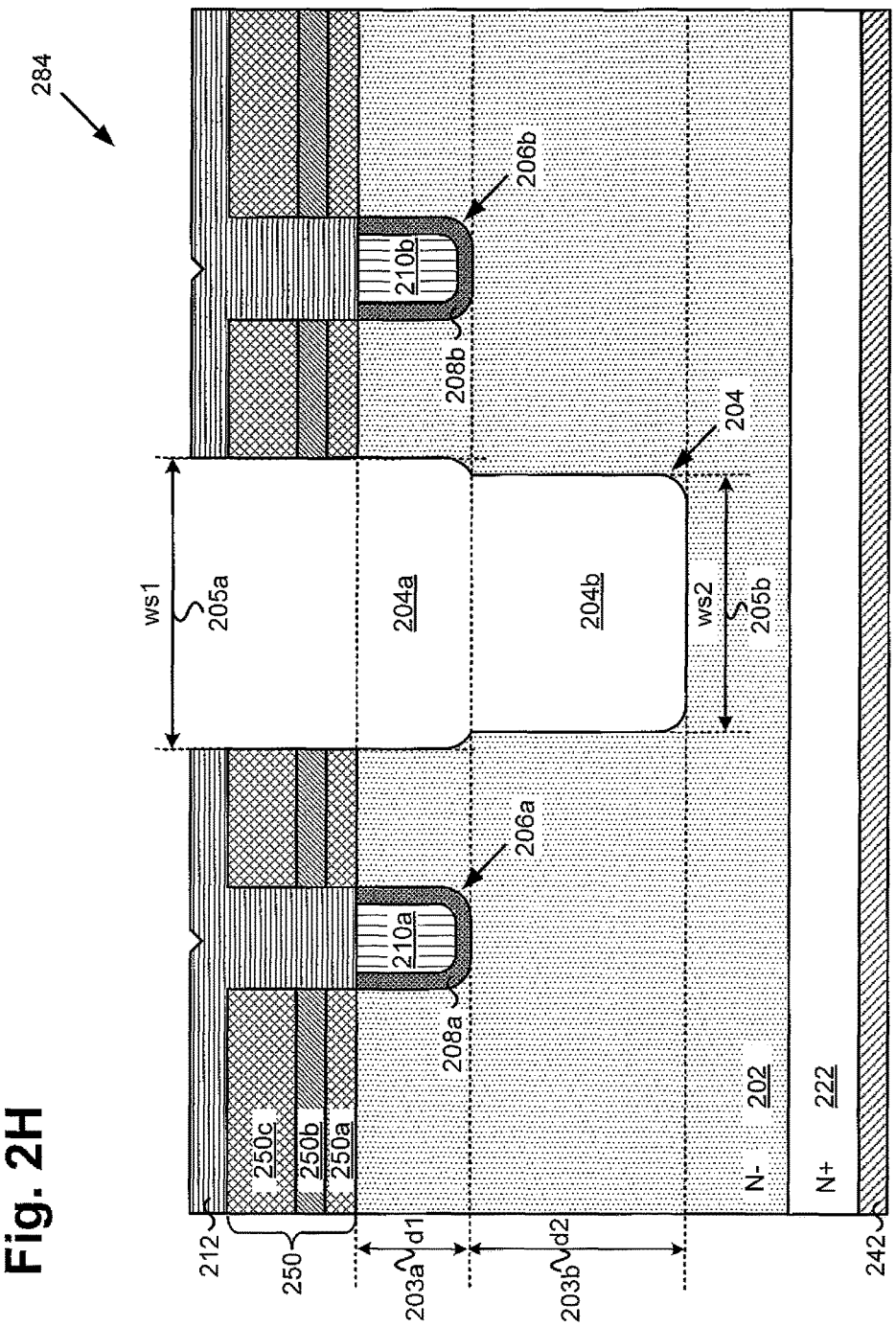
FIG. 2H illustrates a perspective cross-sectional view of a portion of a semiconductor structure processed in accordance with an intermediate action in the flowchart of FIG. 1 according to one implementation of the present application.
Figure 21:
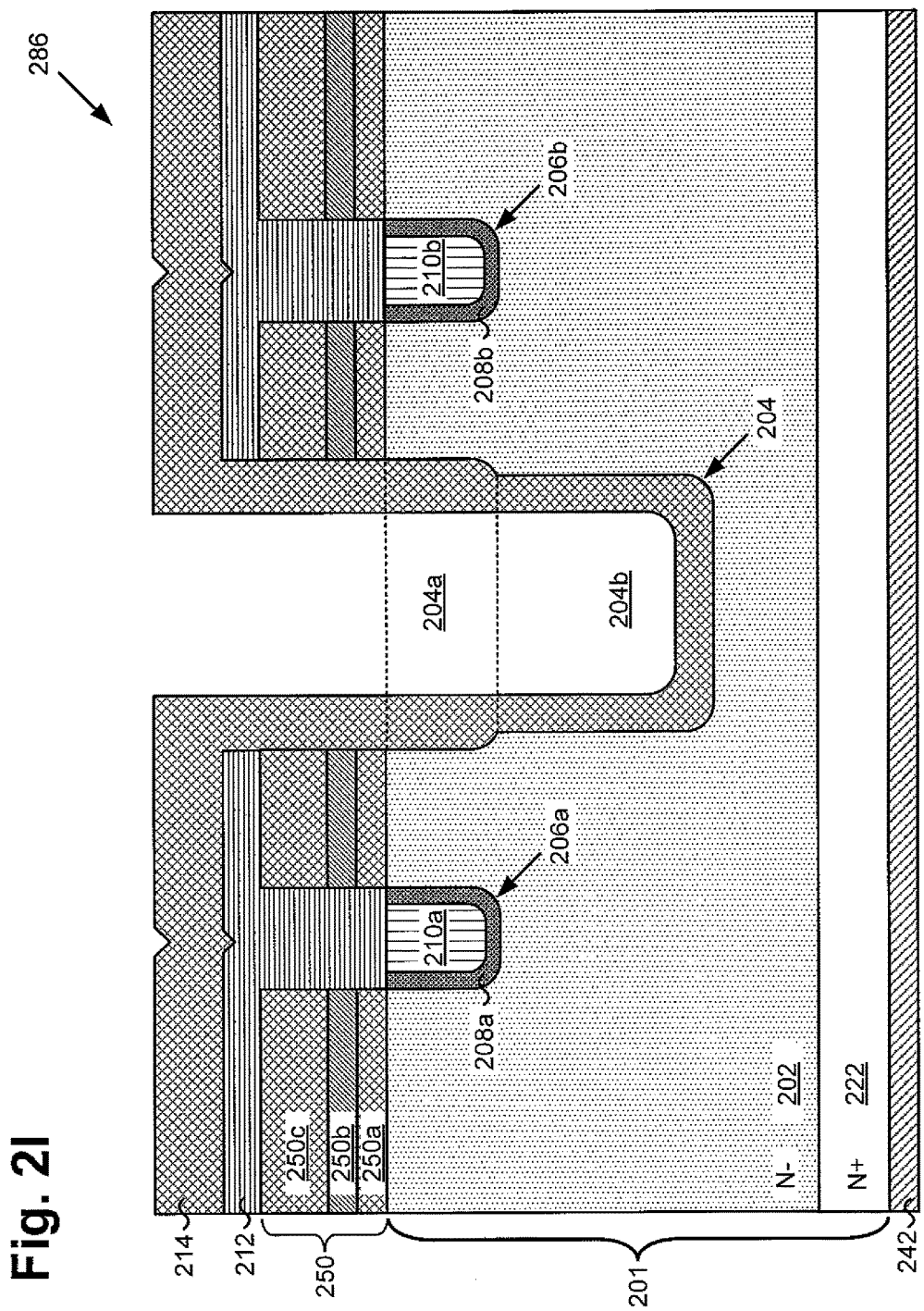

Referring to action 184 in FIG. 1 and semiconductor structure 284 in FIG. 2H, action 184 includes forming a second portion of the source trench under the first portion. Referring to FIG. 2H, semiconductor structure 284 illustrates a cross-sectional view of a portion of a semiconductor structure after completion of action 184 in flowchart 100 of FIG. 1, according to one implementation of the present disclosure. As illustrated in FIG. 2H, semiconductor structure 284 includes source trench 204 having second portion 204b under first portion 204a in drift region 202. In the present implementation, second portion 204b of source trench 204 may be formed by etching drift region 202 using, for example, an anisotropic etch. It is noted that, since first portion 204a of source trench 204 is formed in action 172 along with gate trenches 206a and 206b, second portion 204b of source trench 204 can be formed below first portion 204a substantially without misalignment.

As illustrated in FIG. 2H, second portion 204b of source trench 204 extends into drift region 202, and includes substantially parallel sidewalls extending into a bottom. In the present implementation, second portion 204b of source trench 204 includes a U-shaped bottom. In another implementation, second portion 204b of source trench 204 may include sloped sidewalls and/or a flat bottom.

As illustrated in FIG. 2H, in the present implementation, first portion 204a of source trench 204 extends to depth 203a of gate trenches 206a and 206b in drift region 202. Second portion 204b of source trench 204 extends further into drift region 202 to depth 203b below depth 203a. Depth 203b of second portion 204b is substantially greater than depth 203a of first portion 204a. First portion 204a of source trench 204 has width 205a, while second portion 204b of source trench 204 has width 205b that is narrower that width 205a.

Referring to action 186 in FIG. 1 and semiconductor structure 286 in FIG. 2I, action 186 includes forming a source trench dielectric liner in the source trench. Referring to FIG. 2I, semiconductor structure 286 illustrates a cross-sectional view of a portion of a semiconductor structure after completion of action 186 in flowchart 100 of FIG. 1, according to one implementation of the present disclosure. As illustrated in FIG. 2I, semiconductor structure 286 includes source trench dielectric liner 214 in source trench 204 and over gate trench dielectric capping layer 212. Source trench dielectric liner 214 lines the sidewalls of first portion 204a and the sidewalls and the bottom of second portion 204b. In the present implementation, source trench dielectric liner 214 includes tetraethyloichosilicate (TEOS). In other implementations, source trench dielectric liner 214 may include other suitable dielectric material, such as silicon oxide or silicon nitride.

Referring to action 188 in FIG. 1 and semiconductor structure 288 in FIG. 2J, action 188 includes forming a source trench conductive filler in the source trench. Referring to FIG. 2J, semiconductor structure 288 illustrates a cross-sectional view of a portion of a semiconductor structure after completion of action 188 in flowchart 100 of FIG. 1, according to one implementation of the present disclosure. As illustrated in FIG. 2J, semiconductor structure 288 includes source trench conductive filler 216 in source trench 204 and over source trench dielectric liner 214. Source trench conductive filler 216 fills the entire space in first portion 204a and second portion 204b of source trench 204. In the present implementation, source trench conductive filler 216 includes doped polycrystalline silicon. In another implementation, gate trench conductive filler 210 may include any suitable conductive material, such as metallic material.

Figure 2K:
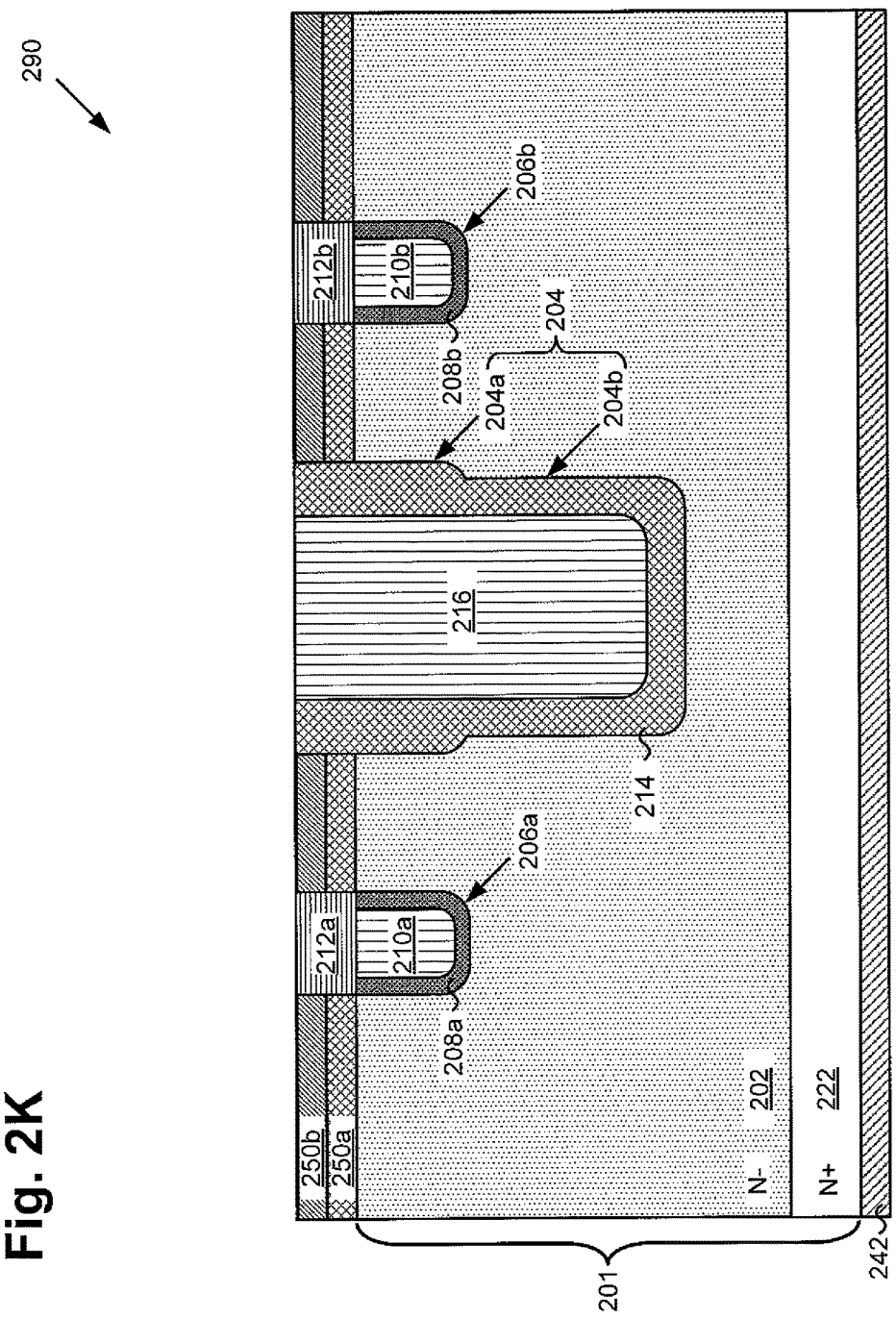
FIG. 2K illustrates a perspective cross-sectional view of a portion of a semiconductor structure processed in accordance with an intermediate action in the flowchart of FIG. 1 according to one implementation of the present application.

Referring to action 190 in FIG. 1 and semiconductor structure 290 in FIG. 2K, action 190 includes planarizing the source trench conductive filler the source trench dielectric liner with the second masking layer of the patterned photoresist mask. Referring to FIG. 2K, semiconductor structure 290 illustrates a cross-sectional view of a portion of a semiconductor structure after completion of action 190 in flowchart 100 of FIG. 1, according to one implementation of the present disclosure. As illustrated in FIG. 2K, semiconductor structure 290 includes source trench conductive filler 216 and source trench dielectric liner 214 in source trench 204, gate electrode 210a and gate trench dielectric liner 208a in gate trench 206a, and gate electrode 210b and gate trench dielectric liner 208b in gate trench 206b. Semiconductor structure 290 also includes gate trench dielectric cap 212a over gate trench 206a and gate trench dielectric cap 212b over gate trench 206b. As illustrated in FIG. 2K, excess portions of source trench conductive filler 216, source trench dielectric liner 214, gate trench dielectric capping layer 212 and third masking layer (e.g., an oxide based layer) 250c of patterned photoresist mask 250 are removed by, for example, chemical mechanical polishing (CMP). As a result, source trench conductive filler 216, source trench dielectric liner 214, gate trench dielectric caps 212a and 212b and second masking layer 250b have a coplanar top surface.

Figure 2L:
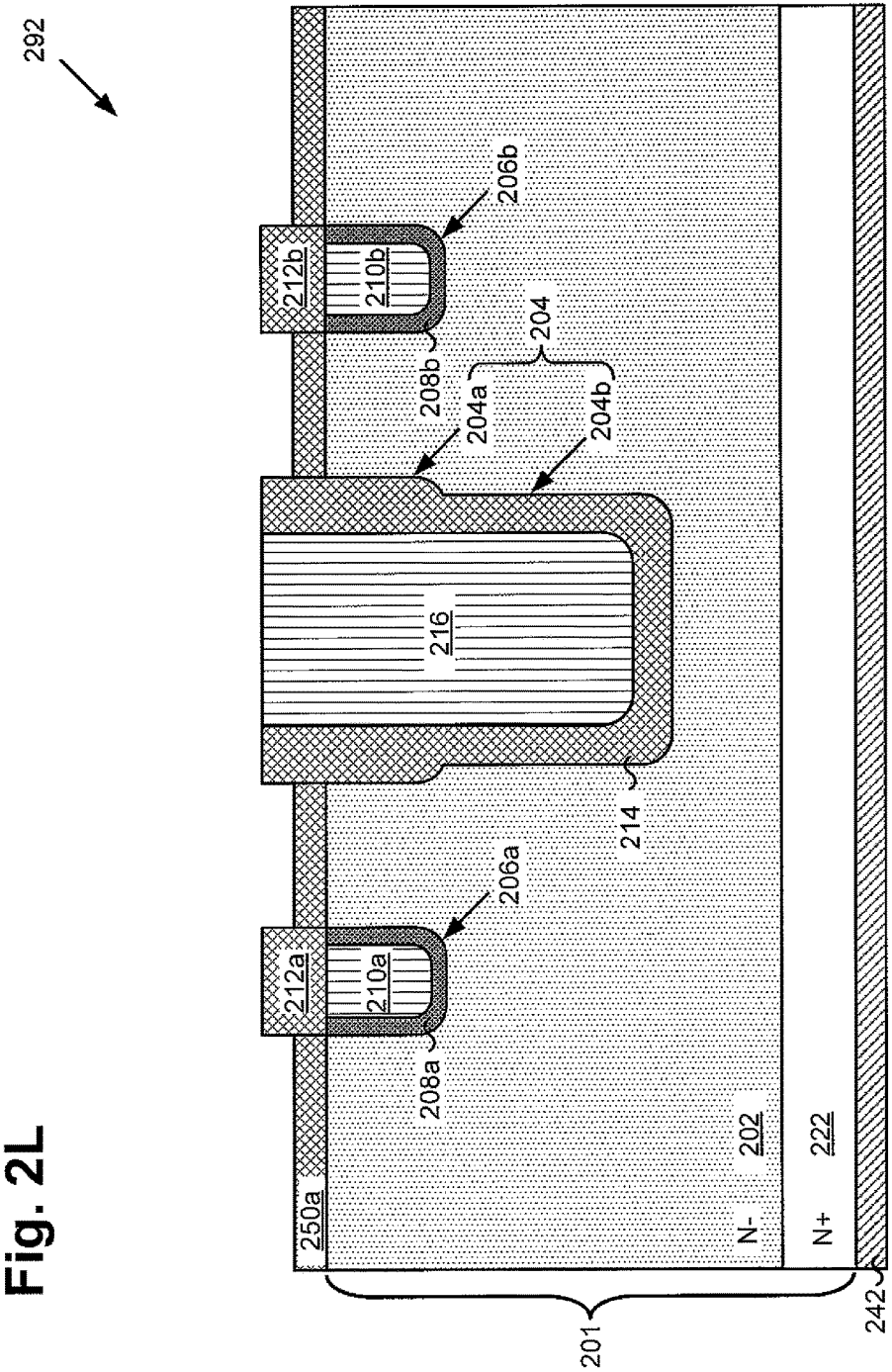
FIG. 2L illustrates a perspective cross-sectional view of a portion of a semiconductor structure processed in accordance with an intermediate action in the flowchart of FIG. 1 according to one implementation of the present application.

Referring to action 192 in FIG. 1 and semiconductor structure 292 in FIG. 2L, action 192 includes removing the second masking layer of the photoresist mask. Referring to FIG. 2L, semiconductor structure 292 illustrates a cross-sectional view of a portion of a semiconductor structure after completion of action 192 in flowchart 100 of FIG. 1, according to one implementation of the present disclosure. As illustrated in FIG. 2L, second masking layer (e.g., a nitride based layer) 250b in semiconductor structure 290 is removed by, for example, etching, such that an opening is formed between gate trench dielectric cap 212a and source trench 204 for a contact trench to be subsequently formed. Similarly, another opening is formed between source trench 204 and gate trench dielectric cap 212b for an contact trench to be subsequently formed.

Figure 2M:
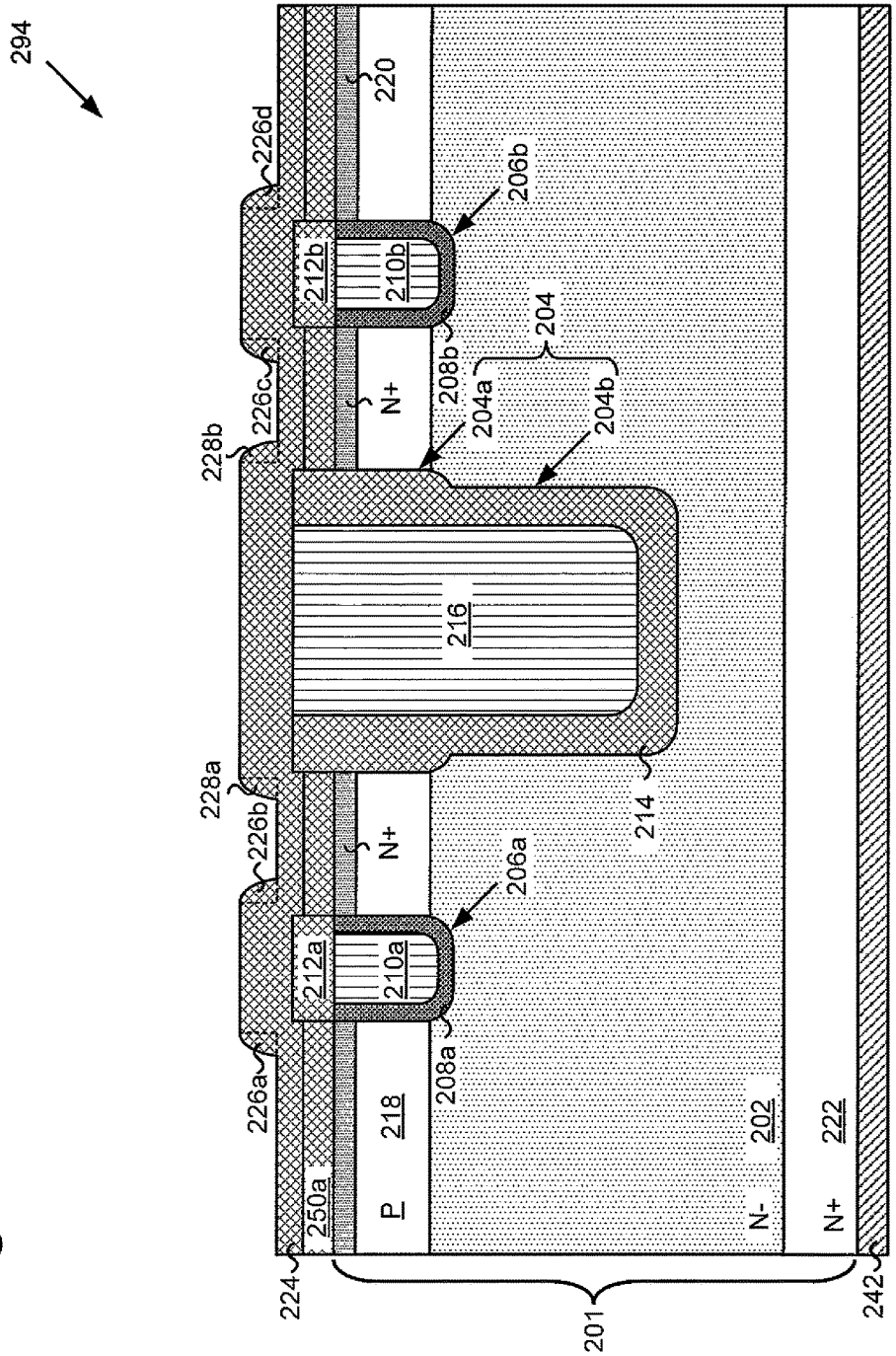
FIG. 2M illustrates a perspective cross-sectional view of a portion of a semiconductor structure processed in accordance with an intermediate action in the flowchart of FIG. 1 according to one implementation of the present application.

Referring to action 194 in FIG. 1 and semiconductor structure 294 in FIG. 2M, action 194 includes forming a base region and a source region in the semiconductor substrate, forming a conformal spacer layer over the gate trench and the source trench, and forming source trench sidewall spacers and gate trench sidewall spacers. Referring to FIG. 2M, semiconductor structure 294 illustrates across-sectional view of a portion of a semiconductor structure after completion of action 194 in flowchart 100 of FIG. 1, according to one implementation of the present disclosure. As illustrated in FIG. 2M, semiconductor structure 294 includes base region 218, source region 220 in semiconductor substrate 201 above drift region 202. Semiconductor structure 294 also includes conformal spacer layer 224 which covers first masking layer (e.g., a pad oxide layer) 250a, gate trench dielectric caps 212a and 212b, source trench dielectric liner 214 and source trench conductive filler 216. In addition, semiconductor structure 294 includes gate trench sidewall spacers 226a and 226b over gate trench 206a, source trench sidewall spacers 228a and 228b over source trench 204, and gate trench sidewall spacers 226c and 226d over gate trench 206b.

In the present implementation, base region 218 may be formed by implanting a channel dopant into semiconductor substrate 201. For example, base region 218 is situated between gate trench 206a and source trench 204, and between source trench 204 and gate trench 206b. In the present implementation, base region 218 is of the second conductivity type, and is shown as having P conductivity by way of example. In the present implementation, base region 218 may include a P type dopant, such as boron. In another implementation, base region 218 may include an N type dopant, such as phosphorus or arsenic. For example, a P type dopant, such as boron ions, may be implanted through first masking layer (e.g., a pad oxide layer) 250a and into semiconductor substrate 201. In other implementations, N type dopant material and other appropriate implantation methods may be used to form base region 218. The implant energy and dopant concentration may vary based on the specific needs of a particular application.

Thereafter, source dopant is implanted through first masking layer (e.g., a pad oxide layer) 250a and into semiconductor substrate 201 to form source region 220 over base region 218. For example, source region 220 is situated between gate trench 206a and source trench 204, and between source trench 204 and gate trench 206b, over base region 218. In the present implementation, source region 220 is of the first conductivity type, and is shown as having N+ conductivity by way of example. In the present implementation, source region 220 may include an N type dopant, such as phosphorus or arsenic. In another implementation, source region 220 may include a P type dopant, such as boron. For example, an N type dopant, such as phosphorus or arsenic, may be implanted through first masking layer (e.g., a pad oxide layer) 250a and into semiconductor substrate 201. In other implementations, P type dopant material and other appropriate implantation methods may be used to form source region 220. The implant energy and dopant concentration may vary based on the specific needs of a particular application.

As illustrated in FIG. 2M, conformal spacer layer 224 is formed over first masking layer (e.g., a pad oxide layer) 250a, gate trench dielectric caps 212a and 212b, source trench dielectric liner 214 and source trench conductive filler 216. In the present implementation, conformal spacer layer 224 includes dielectric material, such as silicon oxide. Conformal spacer layer 224 may be formed using any suitable method, such as chemical vapor deposition (CVD), plasma enhanced chemical vapor deposition (PECVD), sputtering, or evaporation. Gate trench sidewall spacers 226a and 226b are formed along the sidewalls of conformal spacer layer 224 over gate trench 206a. Source trench sidewall spacers 228a and 228b are formed along the sidewalls of conformal spacer layer 224 over source trench 204. Gate trench sidewall spacers 226c and 226d are formed along the sidewalls of conformal spacer layer 224 over gate trench 206b.

Figure 2N:
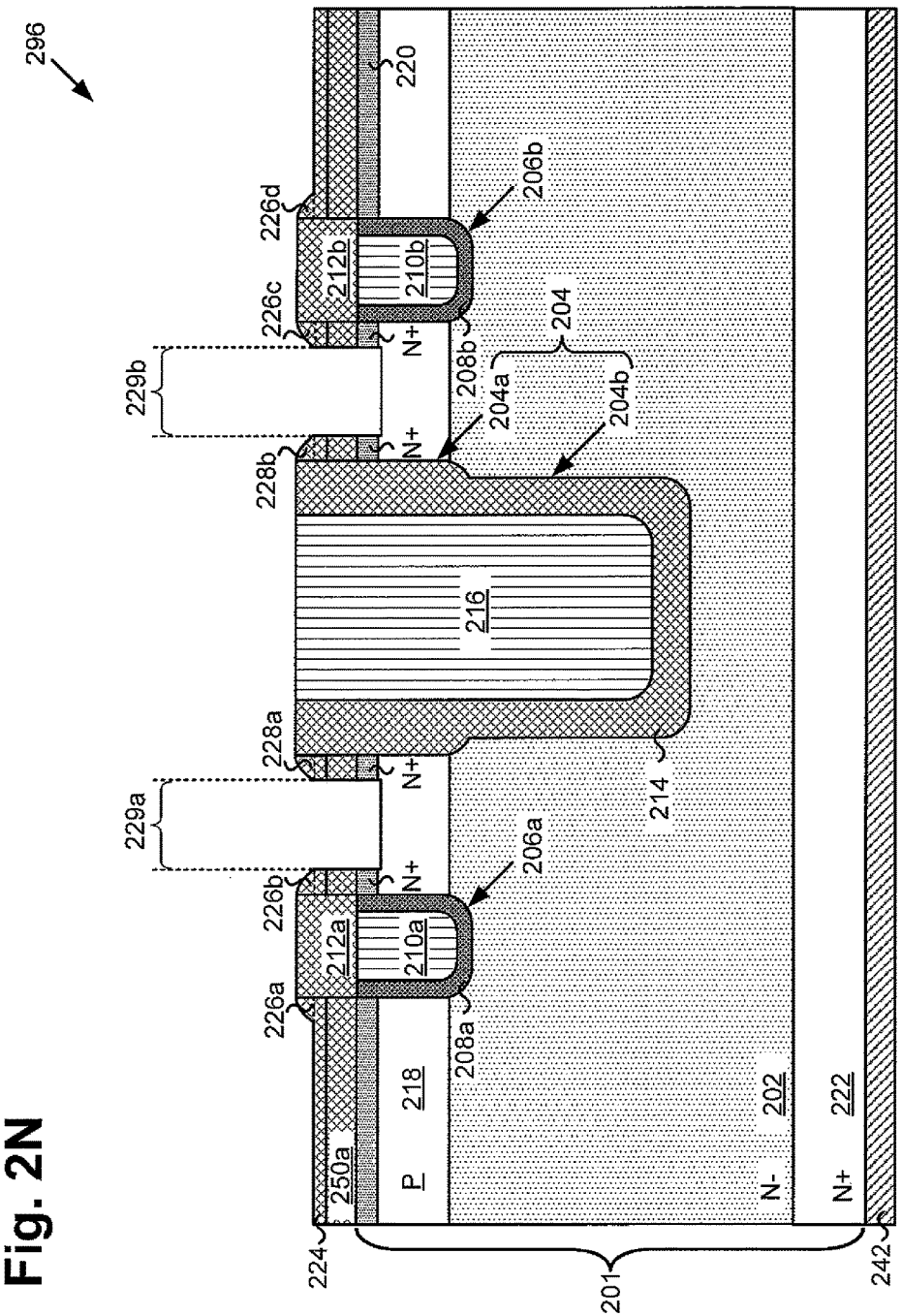
FIG. 2N illustrates a perspective cross-sectional view of a portion of a semiconductor structure processed in accordance with an intermediate action in the flowchart of FIG. 1 according to one implementation of the present application.
Figure 20:
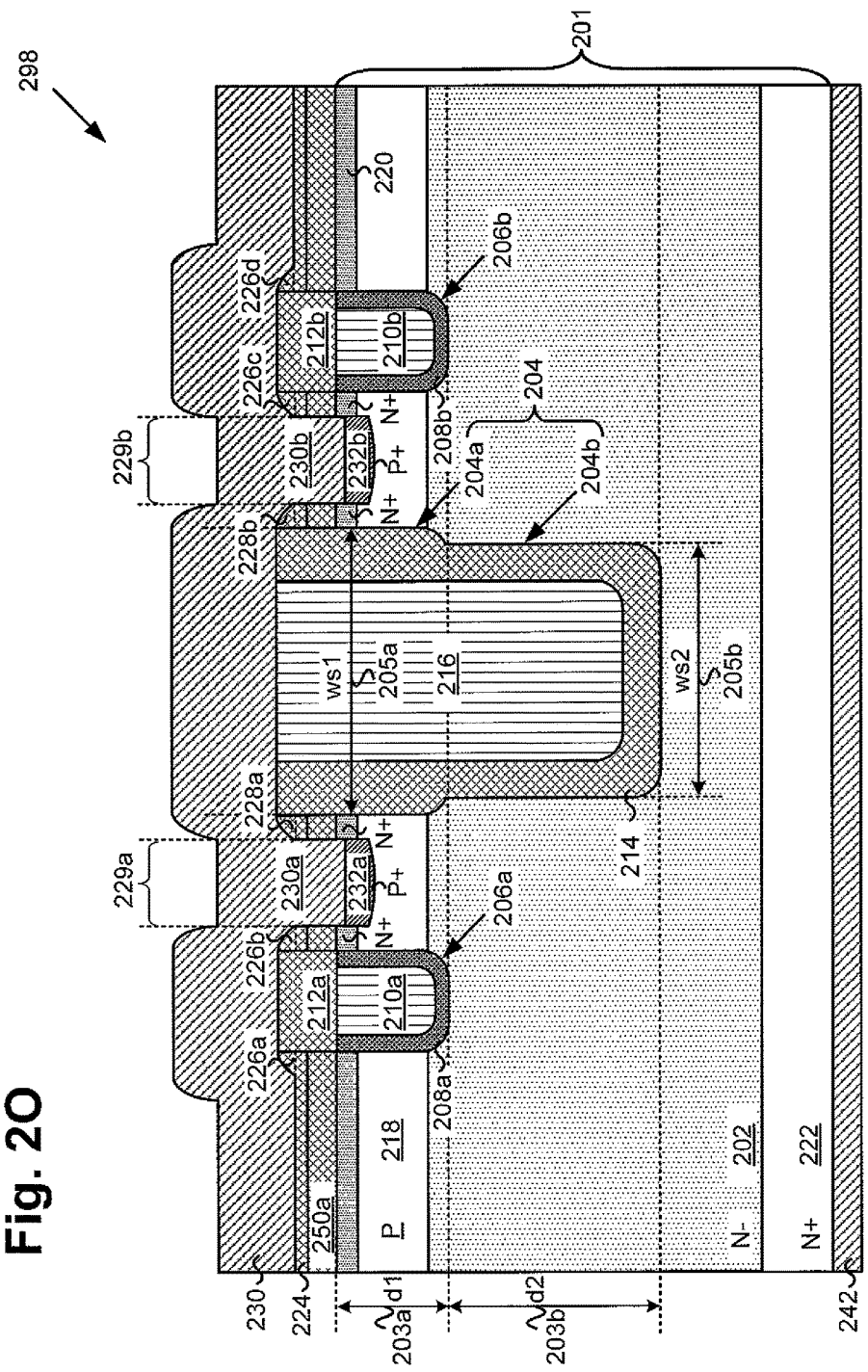

Referring to action 196 in FIG. 1 and semiconductor structure 296 in FIG. 2N, action 196 includes removing portions of the conformal spacer layer to expose the source trench conductive filler, and forming a contact trench. Referring to FIG. 2N, semiconductor structure 296 illustrates a cross-sectional view of a portion of a semiconductor structure after completion of action 196 in flowchart 100 of FIG. 1, according to one implementation of the present disclosure. As illustrated in FIG. 2N, semiconductor structure 296 includes contact trench 229a between gate trench 206a and source trench 204, and contact trench 229b between source trench 204 and gate trench 206b. An oxide etch back may be performed to remove portions of conformal spacer layer 224 and expose source trench conductive filler 216 on a top surface thereof. Then, an contact etch may be performed to form contact trenches 229a and 229b by etching through conformal spacer layer 224, first masking layer (e.g., a pad oxide layer) 250a and source region 220, and into base region 218. Contact trench 229a is self-aligned between gate trench 206a and source trench 204, while contact trench 229b is self-aligned between source trench 204 and gate trench 206b.

As a result of the single photolithography masking action utilized during the fabrication process, according to implementations of the present application, source trench 204 is spaced to be substantially centered between adjacent gate trenches 206a and 206b. Consequently, contact trenches 229a and 229b are self-aligned between respective gate and source trenches. In turn, subsequently formed body contacts and source contacts in respective contact trenches 229a and 229b are also self-aligned between respective gate and source trenches. Through this self-alignment procedure, source and body contacts are not limited by conventional fabrication processes, such as photolithography, and can have reduced widths, thereby increasing cell density.

Referring to action 198 in FIG. 1 and semiconductor structure 298 in FIG. 2O, action 198 includes forming a body contact and a source contact in the contact trench. Referring to FIG. 2O, semiconductor structure 298 illustrates a cross-sectional view of a portion of a semiconductor structure after completion of action 198 in flowchart 100 of FIG. 1, according to one implementation of the present disclosure. As illustrated in FIG. 2O, semiconductor structure 298 includes body contacts 232a and 232b in contact trenches 229a and 229b, respectively.

As illustrated in FIG. 2O, semiconductor structure 298 includes semiconductor substrate 201 having drain region 222, drift region 202, base region 218, source region 220, source contact 230, and body contacts 232a and 232b. Semiconductor structure 298 also includes source trench 204 having first portion 204a and second portion 204b, and gate trenches 206a and 206b in semiconductor substrate 201. Source trench 204 extends through base region 218 and into drift region 202. Gate trenches 206a and 206b also extend through base region 218 and into drift region 202. As illustrated in FIG. 2O, body contacts 232a and 232b are situated near a top surface of semiconductor substrate 201. Source region 220 is also situated near the top surface of semiconductor substrate 201. Semiconductor structure 298 also includes drain contact layer 242 coupled to drain region 222, and source contact 230 coupled to source region 220, body contacts 232a and 232b, and source trench conductive filler 216 in source trench 204.

As illustrated in FIG. 2O, body contacts 232a and 232b and source region 220 are situated near the top surface of semiconductor substrate 201 and over base region 218. Base region 218 is situated over drift region 202, which is situated over drain region 222. In the present implementation, drain region 222, drift region 202, base region 218, source region 220 and body contacts 232a and 232b may each include semiconductor material, such as silicon. In the present implementation, drain region 222 is formed in semiconductor substrate 201, such as a silicon substrate. Drain region 222 is of the first conductivity type and is shown as having N+ conductivity by way of example. Drift region 202 includes epitaxial silicon grown on drain region 222. Drift region 202 is of the first conductivity type and is shown as having N− conductivity by way of example. Base region 218 is of the second conductivity type and is shown as having P conductivity by way of example. Source region 220 is of the first conductivity type and is shown as having N+ conductivity by way of example. Body contacts 232a and 232b are of the second conductivity type and are shown as having P+ conductivity by way of example. However, in another implementation, drain region 222, drift region 202, base region 218, source region 220 and body contacts 232a and 232b may each include the opposite conductivity type, and be formed in various ways without deviating from the scope of the present disclosure.

As illustrated in FIG. 2O, gate trenches 206a and 206b extend through base region 218 and into drift region 202. Gate trenches 206a and 206b each have opposing sidewalls that are substantially parallel to one another (in the present example) and extend into a bottom. Gate trench 206a includes gate trench dielectric liner 208a lining the sidewalls and the bottom thereof, and gate electrode 210a. Gate trench 206b includes gate trench dielectric liner 208b lining the sidewalls and the bottom thereof, and gate electrode 210b. Gate trench dielectric liners 208a and 208b may include any suitable dielectric material, such as silicon oxide. Gate electrodes 210a and 210b may include any suitable conductive material, such as doped polycrystalline silicon, metal and/or metal alloy. Gate trench dielectric caps 212a and 212b are formed over gate trenches 206a and 206b, respectively. Gate trench dielectric caps 212a and 212b include dielectric material and electrically insulate respective gate electrodes 210a and 210b from source contact 230.

As illustrated in FIG. 2O, source trench 204 extends through base region 218 and into drift region 202. Source trench 204 includes first portion 204a having depth 203a and width 205a, and second portion 204b having depth 203b and width 205b, where depth 203b is greater than depth 203a, and width 205a is greater than width 205b. Source trench 204 includes source trench dielectric liner 214, which line the sidewalls of first portion 204a, and the sidewalls and the bottom of second portion 204b. Source trench dielectric liner 214 may include any suitable dielectric material, such as silicon oxide. Source trench conductive filler 216 may include any suitable conductive material, such as doped polycrystalline silicon, metal and/or metal alloy.

As illustrated in FIG. 2O, body contacts 232a and 232b are situated in contact trenches 229a and 229b, respectively, over base region 218. Body contacts 232a and 232b may be formed by implanting a P type dopant in contact trenches 229a and 229b, respectively. Source contact 230 may be formed over conformal spacer layer 224, gate trench dielectric caps 212a and 212b, body contacts 232a and 232b, source trench dielectric liner 214, and source trench conductive filler 216, as a continuous layer. Source contact 230 is coupled to source region 220 between gate trench 206a and source trench 204, and between source trench 204 and gate trench 206b. For example, portion 230a of source contact 230 is self-aligned between gate trench 206a and source trench 204, while portion 230b of source contact 230 is self-aligned between source trench 204 and gate trench 206b. Source contact 230 is also coupled to base region 218 through body contacts 232a and 232b. In the present implementation, source contact 230 includes conductive material, such as metal and/or metal alloy.

As illustrated in FIG. 2O, first masking layer 250a and conformal spacer layer 224 are situated over source region 220 to provide sufficient screening and separation between source trench conductive filler 216 and gate electrodes 210a and 210b. Also, in semiconductor structure 298, source contact 230 is situated on and electrically connected to body contacts 232a and 232b, source region 220, and source trench conductive filler 216 in source trench 204. Drain contact layer 242 is situated below and electrically connected to drain region 222. Source contact 230 and drain contact layer 242 include conductive material, such as metal and/or metal alloy, and are utilized to form a current path between drain region 222 and source region 220 during conduction of semiconductor structure 298. In the present implementation, source trench 204 having source trench conductive filler 216 and gate trenches 206a and 206b having respective gate electrodes 210a and 210b are configured to achieve a charge balancing effect and enable two-dimensional depletion in drift region 202 during the operation of the semiconductor device, such as a power MOSFET or an IGBT.

As shown in FIG. 2O, source trench 204 is spaced to be substantially centered between adjacent gate trenches 206a and 206b, as a result of the single photolithography masking action utilized during the fabrication process, according to implementations of the present application. Thus, misalignments between gate and source trenches can be substantially eliminated. The single photolithography masking action also enables self-aligned body and source contacts to further remove alignment constraints imposed during the contact formation.

As illustrated in FIG. 2O, contact trenches 229a and 229b are self-aligned between respective gate and source trenches. In turn, body contacts 232a and 232b and source contact 230 (e.g., portions 230a and 230b) in respective contact trenches 229a and 229b are also self-aligned between respective gate and source trenches. Through this self-alignment procedure, source and body contacts are not limited by conventional fabrication processes, such as photolithography, and can have reduced widths, thereby increasing cell density. In addition, implementations of the present application enable enhanced electrical performance characteristics, such as lower $R_{DSon}$, and lower voltage nodes for charge balance power semiconductor devices, such as MOSFETs, IGBTs, and the like.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of forming a semiconductor device, said method comprising:
   forming a semiconductor substrate including a drain region, a drift region above said drain region, a base region above said drift region, and a source region above said base region, said drain region, said drift region and said source region having a first conductivity type and said base region having a second conductivity type opposite said first conductivity type;
   forming a gate trench and a first portion of a source trench in said semiconductor substrate and both extending into said drift region to a same first depth in said semiconductor substrate, said first portion of said source trench being wider than said gate trench;
   forming a gate electrode in said gate trench;
   after forming said gate trench and said first portion of said source trench, forming a second portion of said source trench under said first portion and extending deeper into said drift region than said first portion, said second portion being narrower than said first portion and extending to a second depth in said semiconductor substrate greater than said first depth;
   lining sidewalls of said first portion, sidewalls of said second portion and a bottom of said second portion with a dielectric material; and
   forming a conductive filler in said source trench, said conductive filler insulated from the surrounding semiconductor substrate by said dielectric material.

2. The method of claim 1, further comprising forming a patterned photoresist mask over said substrate to define a width of said first portion of said source trench and a width of said gate trench.

3. A method of forming a semiconductor device, the method comprising:
   forming a patterned mask over a semiconductor substrate, the patterned mask having a first opening with a first width and a second opening with a second width greater than the first width;
   in a single trench process, etching regions of the semiconductor substrate unmasked by the first and second openings in the patterned mask to form a gate trench and a first portion of a source trench in the semiconductor substrate, the gate trench having a width defined by the first width of the first opening in the patterned mask and the first portion of the source trench having a width defined by the second width of the second opening in the patterned mask;

forming a gate electrode in the gate trench, the gate electrode being insulated from the semiconductor substrate;

while the gate trench is protected, etching through a bottom of the first portion of the source trench to form a second portion of the source trench deeper in the semiconductor substrate than the first portion; and forming a source trench conductive filler in the first and the second portions of the source trench.

4. The method of claim 3, wherein forming the patterned mask over the semiconductor substrate comprises:

successively forming a first masking layer, a second masking layer and a third masking layer over the semiconductor substrate; and patterning the first masking layer, the second masking layer and the third masking layer using a trench mask.

5. The method of claim 4, wherein the first masking layer comprises a pad oxide layer, the second masking layer comprises a nitride-based layer and the third masking layer comprises an oxide-based layer.

6. The method of claim 3, wherein the same patterned mask is used to etch the second portion of the source trench into the semiconductor substrate.

7. The method of claim 3, wherein the first portion of the source trench extends to a same depth in the semiconductor substrate as the gate trench.

8. The method of claim 3, wherein the source trench and the gate trench each have a striped layout, and wherein the gate trench and the source trench are substantially parallel to one another in the semiconductor substrate.

9. The method of claim 3, wherein forming the gate electrode in the gate trench comprises:

forming a gate trench dielectric liner in the gate trench and the first portion of the source trench;

forming a gate trench conductive filler in the gate trench and along sidewalls and a bottom of the first portion of the source trench; and removing excess portions of the gate trench conductive filler above the semiconductor substrate to form the gate electrode in the gate trench.

10. The method of claim 9, herein etching through the bottom of the first portion of the source trench to form the second portion of the source trench comprises:

removing the gate trench conductive filler from the sidewalls and the bottom of the first portion of the source trench;

after removing the gate trench conductive filler from the sidewalls and the bottom of the first portion of the source trench, forming a gate trench dielectric capping layer over the gate trench and in the first portion of the source trench;

removing the gate trench dielectric capping layer and at least part of the gate trench dielectric liner from the first portion of the source trench; and after removing the gate trench dielectric capping layer and at least part of the gate trench dielectric liner from the first portion of the source trench, etching the second portion of the source trench into the semiconductor substrate through the second opening in the patterned mask.

11. The method of claim 10, wherein the gate trench dielectric capping layer fills the entire first opening in the patterned mask above the gate trench and only partly fills the first portion of the source trench prior to removal.

12. The method of claim 10, wherein removing the gate trench dielectric capping layer and at least part of the gate trench dielectric liner from the first portion of the source trench comprises:

using a breakthrough oxide etch back to remove the gate trench dielectric capping layer and at least part of the gate trench dielectric liner from the first portion of the source trench.

13. The method of claim 10, wherein the sidewalk and the bottom of the first portion of the source trench remain covered with residual gate trench dielectric liner.

14. The method of claim 9, wherein removing excess portions of the gate trench conductive filler above the semiconductor substrate to form the gate electrode in the gate trench comprises:

using an etch back process and the patterned mask to remove the gate trench conductive filler from a top of the photoresist mask, above the gate trench and in the first portion of the source trench.

15. The method of claim 3, wherein forming the source trench conductive filler in the first and the second portions of the source trench comprises:

after etching through the bottom of the first portion of the source trench to form the second portion of the source trench, forming a source trench dielectric liner in the source trench which lines sidewalls of the first portion and sidewalls and a bottom of the second portion; and after forming the source trench dielectric liner in the source trench, filling the source trench with a conductive material.

16. The method of claim 15, wherein the conductive material comprises doped polycrystalline silicon or a metallic material.

17. The method of claim 15, further comprising:

planarizing the source trench conductive filler and the source trench dielectric liner using a masking layer of the patterned mask.

18. The method of claim 3, further comprising:

after forming the gate electrode in the gate trench and the source trench conductive filler in the source trench, removing one or more layers of the patterned mask except at least a layer of the patterned mask in contact with the semiconductor substrate; and forming a conductive material over the layer of the patterned mask in contact with the semiconductor substrate, the conductive material extending to a source region and a body contact region of the semiconductor substrate through an opening in the layer of the patterned mask in contact with the semiconductor substrate.

19. The method of claim 3, wherein the first portion of the source trench extends to a depth of the gate trench in a drift region of the semiconductor substrate, and wherein the second portion of the source trench extends further into the drift region to a depth below the depth of the gate trench.

20. The method of claim 3, wherein the second portion of the source trench has a width that is narrower than the width of the first portion of the source trench.

* * * * *

UNITED STATES PATENT AND TRADEMARK OFFICE
CERTIFICATE OF CORRECTION

PATENT NO. : 10,141,415 B2  
APPLICATION NO. : 14/993292  
DATED : November 27, 2018  
INVENTOR(S) : A. Amali et al.

Page 1 of 1

It is certified that error appears in the above-identified patent and that said Letters Patent is hereby corrected as shown below:

Column 14, Line 11 (Claim 13, Line 1), please change "sidewalk" to -- sidewalls --.

Signed and Sealed this  
Twenty-sixth Day of February, 2019

Andrei Iancu  
*Director of the United States Patent and Trademark Office*